US012638524B2

(12) United States Patent
    Nittka et al.

(10) Patent No.: US 12,638,524 B2
(45) Date of Patent: May 26, 2026

(54) METHOD FOR CARRYING OUT A MAGNETIC RESONANCE IMAGING EXAMINATION OF AN ANATOMIC REGION OF A SUBJECT

(71) Applicants: Siemens Healthcare GmbH, Erlangen (DE); New York University, New York, NY (US)

(72) Inventors: Mathias Nittka, Baiersdorf (DE); Inge Manuela Brinkmann, Nuremberg (DE); Torsten Ehlers, Erlangen (DE); Jan Fritz, Baltimore, MD (US)

(73) Assignees: Siemens Healthineers AG, Forchheim (DE); NEW YORK UNIVERSITY, New York, NY (US)

( * ) Notice: Subject to any disclaimer, the term of this patent is extended or adjusted under 35 U.S.C. 154(b) by 176 days.

(21) Appl. No.: 18/234,582

(22) Filed: Aug. 16, 2023

(65) Prior Publication Data

US 2024/0061056 A1    Feb. 22, 2024

(30) Foreign Application Priority Data

Aug. 17, 2022    (EP) .................................... 22190753

(51) Int. Cl.
    *G01R 33/28*        (2006.01)
    *G01R 33/54*        (2006.01)
(52) U.S. Cl.
    CPC ......... *G01R 33/288* (2013.01); *G01R 33/546* (2013.01)

(58) Field of Classification Search
    CPC ... G01R 33/288; G01R 33/546; G01R 33/543
    See application file for complete search history.

(56) References Cited

U.S. PATENT DOCUMENTS

| | | | |
|---|---|---|---|
| 10,488,473 B2 | 11/2019 | Leussler et al. | |
| 10,718,838 B2 | 7/2020 | Koch et al. | |
| 2011/0038516 A1* | 2/2011 | Koehler .................. | G06T 7/149 |
| | | | 382/128 |

(Continued)

FOREIGN PATENT DOCUMENTS

IN        108303746 B        5/2021

OTHER PUBLICATIONS

McRobbie et al., MRI—From Picture to Proton, 2nd ed., Cambridge University Press, 2006, Part A, section 2.4.2, p. 18 (Year: 2006).*

(Continued)

*Primary Examiner* — Daniel R Miller
(74) *Attorney, Agent, or Firm* — Lempia Summerfield Katz LLC

(57)        ABSTRACT

A magnetic resonance imaging examination of an anatomic region of a subject is performed with a magnetic resonance imaging system. A fast metal detection sequence configured to detect the presence of a metal object within or at the subject is performed. A control unit determines whether a metal object is detected, wherein the control unit initiates a standard examination workflow if no metal object is detected during the fast metal detection sequence, and wherein the control unit initiates a modified examination workflow that is different from the standard examination workflow if a metal object is detected during the fast metal detection sequence.

16 Claims, 5 Drawing Sheets

(56)           References Cited

U.S. PATENT DOCUMENTS

| | | | |
|---|---|---|---|
| 2011/0304331 A1* | 12/2011 | Takahashi | G01R 33/483 |
| | | | 324/309 |
| 2017/0307709 A1* | 10/2017 | Koch | G01R 33/56536 |
| 2018/0292491 A1* | 10/2018 | Koch | G01R 33/583 |
| 2019/0146049 A1* | 5/2019 | Koch | G01R 33/5607 |
| | | | 324/309 |

OTHER PUBLICATIONS

McRobbie et al., MRI—From Picture to Proton, 2nd ed., Cambridge University Press, 2006, pp. 18-19, 117 (Year: 2006).*

Metal Artifact Suppression, available Jul. 27, 2022 at https://mriquestions.com/metal-suppression.html (Year: 2022).*

Gupta, Amit, et al. "Metal artifact reduction: standard and advanced magnetic resonance and computed tomography techniques." Radiologic Clinics 53.3 (2015): 531-547.

Kaushik, S. Sivaram, Cathy Marszalkowski, and Kevin M. Koch. "External calibration of the spectral coverage for three- dimensional multispectral MRI." Magnetic resonance in medicine 76.5 (2016): 1494-1503.

* cited by examiner

METHOD FOR CARRYING OUT A MAGNETIC RESONANCE IMAGING EXAMINATION OF AN ANATOMIC REGION OF A SUBJECT

RELATED APPLICATION

This application claims the benefit of EP 22190753.8, filed on Aug. 17, 2022, which is hereby incorporated by reference in its entirety.

FIELD

The present disclosure relates to a method for carrying out a magnetic resonance imaging examination of an anatomic region of a subject, a non-transient computer-readable medium, a control unit (controller), and a magnetic resonance imaging system.

BACKGROUND

The high prevalence of metal implants in patients is a challenge in magnetic resonance (MR) imaging, e.g., in orthopedic MR imaging, since metal related magnetic field distortion may lead to severe degradation of image quality. There are dedicated MR imaging techniques that are configured to reduce metal artifacts. However, the choice of the appropriate methods depends on many parameters, e.g., implant type, material of the implant, location of the implant, and/or scanner field strength. Therefore, it is challenging for the MR operator to find the most appropriate MR methods and/or techniques. This often leads to the application of unsuitable methods, e.g., the method may be insufficient to correct the metal artifacts or a stronger correction than needed may be applied, which may further lead to either suboptimal or even non-diagnostic image quality or an unnecessary extension of acquisition time. Additionally, besides the issue of image degradation, even a safety risk may occur, if a metal implant remains unnoticed before the examination, e.g., due to the patient's not reporting the implant, and the MR scanning is done without any safety considerations.

In the state of the art, the problem is addressed by either excluding implant patients from MR examinations or by relying on well-trained MR personal adapting the scan parameters based on experience. Hence, e.g., based on prior information from the patient or referrer, dedicated imaging methods are selected to reduce metal artefacts. Typically, the imaging protocols are changed on-the-fly based on the apparent level of distortions seen in currently taken images. However, this common approach relies heavily on the expertise of the medical and technical staff as well as on the reliability of information transfer regarding existing metal implants, in particular from patient to medical staff.

SUMMARY AND DESCRIPTION

It is therefore an object to carry out a magnetic resonance imaging examination in a way that takes into account the (possible) existence of metal implants efficiently and reliably.

This object is met or exceeded by a method, a non-transient computer-readable medium, a control unit (controller), and/or a magnetic resonance imaging system according to the claims. Further advantages and features result from the dependent claims, the description, and the attached figures.

According to a first aspect, a method for carrying out a magnetic resonance imaging (MRI) examination of an anatomic region of a subject, in particular of a patient, with a magnetic resonance imaging system is provided. The anatomic region of the subject may for example be a body part, such as an organ or a limb. The method comprises the following acts:

carrying out a fast metal detection sequence configured to detect the presence of a metal object within or at the subject;

determining whether a metal object is detected, wherein a standard examination workflow is initiated when no metal object is detected during the fast metal detection sequence, and wherein a modified examination workflow that is different from the standard examination workflow is initiated when a metal object is detected during the fast metal detection sequence; and carrying out the standard examination workflow or the modified examination workflow depending on the initiation of the control unit.

Preferably, the fast metal detection sequence is carried out at the beginning of the MRI examination. In particular, the fast metal detection sequence may preferably be the first act of the acts listed above to be carried out. Preferably, the fast metal detection sequence is faster or shorter, preferably 10 to 30 times faster, than a typical scout scan, in particular at least 5 times faster than a typical scout scan. The fast metal detection sequence may be optimized to detect the presence of a metal implant inside the subject, in particular inside the patient, and/or of a metal object at the subject. The metal object may for example be a metal implant or other metallic part, such as dental braces. Advantageously, by adding the fast metal detection sequence, the risk may be reduced that an unreported metal object in the subject, in particular in the body part to be scanned, is missed. Due to the short time duration of the metal detection sequence, the overall examination time is not significantly increased.

The control unit (controller) may, for example, be a processing unit (processor) such as a central processing unit (CPU), a graphics processing unit (GPU), a computer or part of a computer. The computer may be a personal computer (PC), a server, and/or a console of the magnetic resonance imaging system. The computer may also be a mobile device, such as a laptop, tablet computer, or mobile phone. The control unit may in particular include a dedicated workflow engine, e.g., a computer program configured to carry out the corresponding method acts. The control unit may be configured to adapt the examination workflow and/or sequence parameters of the examination workflow. The control unit may be adapted to adapt and/or change the workflow either automatically and/or to guide a user to adapt and/or change the examination workflow, in particular without the user needing in-depth technical knowledge about the workflow. The control unit may initiate a standard examination workflow if no metal object is detected during the fast metal detection sequence. Hence, the examination workflow will be carried out as it usually would be carried out, adding only a very short additional metal detection sequence at the beginning that does in particular not change the overall examination time significantly. On the other hand, the control unit may initiate a modified examination workflow— different from the standard examination workflow—if a metal object is detected during the fast metal detection sequence. Hence, the control unit is in particular configured to react to the detection of a metal object and adapt and/or change the examination workflow accordingly. The modification of the examination workflow may for example comprise changing parameters of scan sequences, replacing scan sequences with specialized metal scan sequences, notifying a user about changes, and/or giving advice to a user about further actions to take. The control unit may be configured to provide a modified examination workflow that in interaction with the user adjusts the workflow step by step, in particular by enabling and/or prompting user input and/or giving information and/or advise to the user.

Advantageously, the method according to one embodiment may thus enable an increased safety of operation. For example, in particular, if the existence of a metal implant was not known before the start of the examination, the MR scanning may be stopped when a metal object is detected and preferably before at least one sequence with a longer duration, e.g., longer than 10 seconds and/or longer than the fast metal detection sequence, is started. Accordingly, e.g., an increased risk of implant heating during the sequence with longer duration may be avoided. Furthermore, the image quality may be increased by providing the modified examination workflow that may be adapted to the presence of the metal object and/or on the subject's individual condition. Thus, a suboptimal or even non-diagnostic image quality may be mitigated. Additionally, a subject throughput, in particular a patient throughput, may be improved by reducing the risk of necessary re-scheduling due to lack of metal object information and/or due to non-sufficient image quality. Furthermore, the risk may be reduced to run unnecessary additional and/or very time-consuming sequences when the influence of the metal object is actually not as great as may be supposed by a user without the information from the fast metal detection sequence.

According to an embodiment, the fast metal detection sequence is configured to have a duration of 0.01 s (seconds) to 10 s, preferably of 0.1 s to 5 s, more preferably of 1 s to 3 s. Preferably, the fast metal detection sequence may have a duration of less than 3%, more preferably less than 1%, still more preferably less than 0.5% of the total examination time. Total examination time may be 10 to 30 minutes, preferably 15 to 25 minutes. Advantageously, the fast metal detection sequence may thus be added to an examination without significantly extending the total scan duration.

According to an embodiment, the fast metal detection sequence is carried out by the magnetic resonance imaging system, using a transmit coil, wherein the transmit coil is in particular being operated in a pulse mode and/or in a continuous wave mode. Optionally, the fast metal detection sequence may further be carried out by using a receive coil configured to receive the signal from the transmit coil and detecting changes to the signal due to the metal object. The transmit coil and/or the receive coil may, for example, be a coil that is also used for the magnetic resonance imaging scans. Alternatively, and/or additionally, the transmit coil may be a coil that is optimized to carry out the fast metal detection sequence. The transmit coil may be operated like a metal detector as known by the state of the art. Advantageously, this may allow to implement the fast metal detection sequence efficiently and relatively easily.

According to an embodiment, the fast metal detection sequence is carried out without or with very low spatial resolution having a voxel size larger than 1 $cm^3$, preferably a voxel size >10 $cm^3$, e.g. of 5 to 100 $cm^3$, in the anatomical region. The metal detection sequence may for example be an adaption of a metal detection sequence known from the state of the art, wherein the duration of the sequence is decreased. The reduction in duration may be achieved by allowing for a reduced spatial resolution. For example, a metal detection sequence as described in U.S. Pat. No. 10,718,838 may be used by reducing the scan time at the cost of reduced spatial resolution and reduced spectral resolution. Alternatively, the fast metal detection sequence may be carried out over the whole sensitive region of a transmit coil, which may be a body or a local oil, without any spatial resolution, for example without using slice select, phase encode, or readout gradients. Alternatively, the spatial encoding may be applied only in certain directions, such as the frequency encoding direction, such that the measured signal only provides a projection of the other two spatial dimensions onto the frequency encoding direction.

According to an embodiment, the fast metal detection sequence is configured to detect off-resonant signals as an indication for the presence of a metal object. In this context, off-resonance may preferably be related to the Larmor frequency. The signals being off-resonant may be caused by spins in the vicinity of the metal object. The magnetic susceptibility of metal is typically very different to the magnetic susceptibility of tissue. Thus, the presence of a metal object, in particular a metal implant, leads to a change of the static magnetic field in the vicinity of the metal object and therewith to strong local off-resonances of the spins. Hence, during an MR examination, the magnetic susceptibility of the metal object may lead to a (local) distortion of the applied magnetic field and thus to a shift of the Larmor frequency of the spins in this area. For example, depending on the position, material, and mass of the metal object, there may for example be off-resonant signals that are a few 100 Hz up to a few 1000 Hz off-resonant. The strength of the field distortions may in particular depend on the shape, location, and material properties of the metal object. Distortions caused by the off-resonances may for example lead to black areas in an image due to signal voids caused by intra-voxel dephasing, to changes in tissue contrast due to failure of fat suppression and saturation bands, to in-plane distortions (offset of the local field leading to a shift of image pixels, and/or to through-plane distortions (local field offsets leading to curved and frayed slices). Accordingly, by detecting off-resonant signals, it may be possible to determine whether a metal object is present, potentially even taking assumptions about the metal material, shape, and location. The fast metal detection sequence may scan without or with very low spatial resolution while searching for off-resonant signals.

According to an embodiment, the modified examination workflow includes a metal localizer scan, which is initiated, in particular automatically by the control unit, when a metal object is detected during the fast metal detection sequence, and wherein the metal localizer scan provides at least one scout image. The metal localizer may use an adapted scan sequence compared to a standard localizer scan. In particular, a turbo spin echo sequence with high bandwidth may be applied. Advantageously, such a sequence may be significantly less prone to field distortions due to the metal object and thus allow an improved imaging of the subject's anatomy. Additionally, the modified examination workflow may include requesting the user to specify a region of interest on the at least one scout image. The user may for example specify the region by defining bounding boxes on the scout image. The metal localizer scan may be carried out in addition to an additional metal detection sequence, in particular as described below. The metal localizer scan may be carried out at the same time and/or before the additional metal detection sequence. For example, while the additional metal detection sequence is running, the user may specify the region of interest. This may allow safe time during the examination workflow. Alternatively, the selection may be done before the additional metal detection sequence, and the metal detection sequence may scan an area based on the selection. Advantageously, the user input may be used to determine the exact region of interest and, based on this determination of the region of interest, to determine the influence of the metal object on the actual diagnostic region, that diagnostic region being in particular the region of interest.

According to an embodiment, the modified examination workflow includes at least one additional metal detection scan, wherein the at least one additional metal detection scan is carried out by the magnetic resonance imaging system and is preferably initiated automatically by the control unit when a metal object is detected during the fast metal detection sequence. The additional metal detection scan may be configured to provide information about the magnitude of the field distortions and the location of the metal object. The additional metal detection scan may be carried out at a location based on the region of interest input by a user and/or based on a spatial location determined by the control unit, e.g., based on the fast metal detection scan and/or on further information provided by the user such as a given organ to be examined. The control unit may be configured to determine the spatial distance between the region of interest, e.g., based on user input, and the metal object, e.g., based on the additional metal detection scan. Advantageously, the additional metal detection scan may provide further information about the impact of the metal object, in particular the impact on the image quality. For example, dependent on the distance between the implant location and the actual region of interest to be examined for diagnosis, the impact of the implant induced distortions may be of more or less relevance.

The additional metal detection scan may be a moderately fast scan with moderate spatial resolution and/or acquiring signal at different off-resonant frequency ranges. For example, a fast low resolution multi-spectral-imaging (MSI) sequence may be used for the additional metal detection scan. The fast low resolution MSI sequence may be used to create a frequency map of the examined anatomic region. This method is for example described in S. S. Kaushik et al. "External Calibration of the Spectral Coverage for Three-Dimensional Multispectral MRI", Magnetic Resonance in Medicine 76:1494-1503 (2016). Based on the result of the additional metal detection scan, field distortions induced by the metal object may be classified and/or the location of the metal object may be determined. Optionally, the type of metal may be evaluated, as well. For example, a thresholding algorithm may determine an extent to which an examination will be affected by the metal object. The additional metal detection scan may be used to determine the further scan protocols to be applied during the examination workflow.

According to an embodiment, the modified examination workflow includes an adapted scan protocol, wherein the adapted scan protocol is adapted based on the results of the at least one additional metal detection scan. The adapted scan protocol may, in particular, be adapted based on the determined position of the metal object and/or based on the determined influence of the metal object on a magnetic resonance scan of the region of interest. For example, the type of sequence, the sequence parameters, such as field of view and/or scan volume, and/or the number of scan sequences to be applied may be determined based on the additional metal detection scan. The control unit may be configured to determine the shortest total scan time that is achievable while achieving an optimized image quality or an image quality that is better than a predetermined threshold of image quality. The threshold may, for example, be based on image sharpness, image distortions and/or image resolution. The adapted scan protocol may be a dedicated scan protocol configured to be carried out in the presence of the metal object, in particular to reduce the amount of metal induced distortions. For example, the bandwidth of both excitations pulse and of the signal readout may be increased to make the magnetic resonance sequence less sensitive. This may reduce through-plane distortions, due to a higher bandwidth of the excitation pulse, and in-plane distortions, due to a high signal readout gradient/bandwidth. The image may thus have less severe variations of the apparent slice thickness, fewer signal voids, and fewer pileup artifacts that are related to in-plane distortions. Additionally, and/or alternatively, a view angle tilting may be applied to compensate for in-plane distortions. Therein, an additional readout gradient is applied along the slice selective direction. Preferably, the amplitude of the additional readout gradient equals the amplitude of the gradient applied during the excitation RF pulse. Additionally, and/or alternatively, a slice encoding for metal artifact correction may be applied. Therein, an additional encoding dimension is applied to enable the correction of through-plane distortions by phase encoding each slice in the third dimension. Therewith, information about the distortion of the slice may be acquired and signal shifts perpendicular to the image plane may be corrected during image reconstruction. For example, an adapted scan protocol as described in or similar as described in A. Gupta et al. "Metal artifact reduction: standard and advanced magnetic resonance and computed tomography techniques", Radiol. Clin. North Am. 2015, 53(3):531-547; doi:10.1016/j.rc1.2014.12.005, may be used.

According to an embodiment, the control unit choses and/or prompts a user to choose from at least three scan protocols to be carried out, wherein a first scan protocol is a standard protocol that is carried out as part of the standard examination workflow when no metal object is detected and/or when a metal object is detected that has a low influence on a region of interest to be examined, wherein a second scan protocol is an adapted scan protocol that is carried out when a metal object is detected that has a medium influence on a region of interest to be examined, wherein a third scan protocol is an adapted scan protocol that is carried out when a metal object is detected that has a strong influence on the region of interest to be examined. A medium influence may be classified to be the case if the metal object causes a field distortion at the region of interest of less than 5 kHz, preferably less than 2 kHz, in particular a field distortion between 10 Hz and 2 kHz, preferably between 100 Hz and 1 kHz. A strong influence may be classified to be the case if the metal object causes a field distortion at the region of interest of more than 1 kHz, preferably more than 2 kHz, in particular a field distortion between 2 kHz and 20 kHz. Additionally, and/or alternatively, the boundary between a medium influence and a strong influence may be a field distortion at the region of interest caused by the metal object of 0.5 kHz to 10 kHz, preferably of 1 kHz to 5 kHz, more preferably of 1 kHz to 2 kHz. The boundary between a low influence and a medium influence may for example be a field distortion at the region of interest caused by the metal object of 1 Hz to 200 Hz, preferably 10 Hz to 100 Hz. Advantageously, in case of low field distortions, i.e., when the metal object has a medium influence, there may be no need to run a sequence with a very long scan time and only moderate changes in scan parameters may be necessary. On the other hand, in the presence of strong distortions, i.e., when the metal object has a strong influence, different acquisition methods with longer scan time and/or compromised image quality may have to be applied. The second scan protocol may include an increased bandwidth of the RF pulse and/or of the signal receiver. Additionally, and/or alternatively the second scan protocol may be different from the first scan protocol in that a gradient echo sequence is replaced by a turbo spin echo sequence and/or that a spectral fat saturation is replaced by a Short-TI Inversion Recovery (STIR) technique or a Dixon method. The third scan protocol may include a stronger adaption of the above adaptions for the second scan protocol. Additionally, and/or alternatively the third scan protocol may include using a Slice Encoding Magnetic Artifact Compensation (SEMAC) technique and/or a Multi-Acquisition Variable Resonance Image Combination (MAVRIC) technique.

According to an embodiment, the modified examination workflow includes giving information and/or suggestions to a user and/or allowing the user to choose from multiple options regarding at least one scan protocol to be carried out, wherein the multiple options comprise choosing from multiple adapted scan protocols to be carried out and/or choosing from multiple adaptions to be applied to the at least one scan protocol. The information may include an alert message, e.g., that metal has been detected. Additionally, and/or alternatively the information may include the strength of detected distortions and/or a determined location of the metal object and/or a determined influence of the metal object. Suggestions may, for example, include recommendations for adapting and/or changing the examination workflow and/or at least one scan protocol of the examination workflow and/or a recommendation to replace a standard scan protocol with a dedicated adapted protocol. The information and/or suggestions may, for example, be presented to the user via guidance windows, e.g., on a digital screen. The modified examination workflow, in particular scan parameters of at least one scan protocol, may be adapted based on the user's input, such as selection of one suggested option or confirmation of a suggested option.

According to an embodiment, during the modified examination workflow, a user is asked for input to specify the region of interest, in particular on a scout image acquired using a metal localizer scan, wherein the user input is used by the control unit to determine which adapted scan protocol to apply or how to adapt the scan protocol. The control unit may determine the distance between the metal object and the region of interest to determine the influence of the metal object on the region of interest. Hence, the user input may advantageously be used to automatically adapt or chose the scan protocol.

According to a further aspect, a non-transient computer-readable medium including a computer program with instructions that when carried out by a control unit of a magnetic resonance imaging system will cause the magnetic resonance imaging system to carry out the method as described herein is provided. The non-transient computer-readable medium may for example be any digital storage medium, such as a hard drive, a server, a cloud memory, a computer, an optical and/or magnetic storage medium, a CD-ROM, an SSD, an SD card, a DVD, a Blu-ray disc and/or a USB stick. All features and advantages of the method may be adapted to the computer-readable medium and vice versa.

According to a further aspect, a control unit configured to carry out the method as described herein is provided. All features and advantages of the method and of the computer-readable medium may be adapted to the control unit and vice versa.

According to a further aspect, a magnetic resonance imaging system for examining a subject, in particular a patient is provided. The magnetic resonance imaging system includes:

a magnetic resonance scanner;

a control unit, wherein the control unit is configured to initiate a fast metal detection sequence via the magnetic resonance scanner and/or via a metal detector in order to detect the presence of a metal object within or at the subject, initiate a standard examination workflow including scanning the subject with a standard scan protocol of the magnetic resonance scanner when no metal object is detected during the fast metal detection sequence, and initiate a modified examination workflow that is different from the standard examination workflow, in particular including scanning the subject with an adapted scan protocol of the magnetic resonance scanner, when a metal object is detected during the fast metal detection sequence. The metal detector may be part of the magnetic resonance imaging system. All features and advantages of the method, of the computer-readable medium, and of the control unit may be adapted to the magnetic resonance imaging system and vice versa. The control unit is, in particular, configured to carry out the method as described herein.

According to an embodiment, the magnetic resonance imaging system further includes:

an output device configured to output optical and/or acoustic information to a user; and a user input device configured to receive user input, wherein the control unit is configured to output information and/or suggestions for the user via the output device when a metal object is detected, to receive user input via the user input device, and to adapt the scan protocol and/or the examination workflow based on the user input. The output device may for example a digital screen, a speaker, and/or a projector. The input device may be a user interface, e.g., a computer mouse or keyboard. All embodiments mentioned herein may be combined with each other.

BRIEF DESCRIPTION OF THE DRAWINGS

The accompanying drawings illustrate various exemplary embodiments and methods of various aspects of the invention.

9                                                        10

Figure 1:
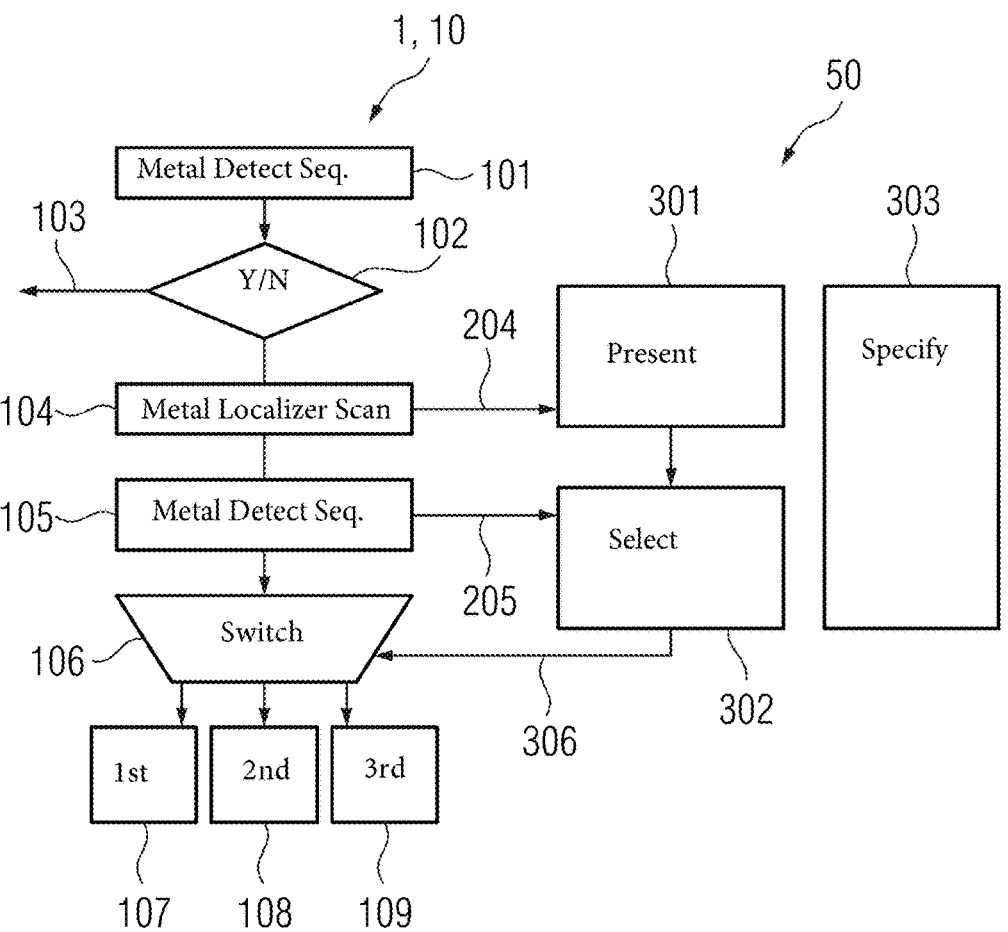
FIG. 1 shows a flow diagram of a method according to an embodiment.

Similar elements are designated with the same reference signs in the drawings.

DETAILED DESCRIPTION

FIG. 1 shows a flow diagram of a method according to an embodiment. On the left side are shown acts taken and initiated by the control unit (controller) 10 and executed by the magnetic resonance imaging system 1. On the right side are acts that are taken by a user over a user interface 50. In a first act 101, a fast metal detection sequence is carried out to quickly detect whether there is a metal object present at or in a patient. The fast metal detection sequence may for example have a duration of 1 to 3 seconds. The fast metal detection sequence may preferably be carried out without or with very low spatial resolution and is configured to detect off-resonant signals as an indication for the presence of a metal object.

Following, in act 102, the control unit 10 determines whether a metal object has been detected. If no metal object has been detected, a standard examination workflow is applied 103. However, if a metal object has been detected, the control unit tries to acquire further information about the impact or influence of the metal object and hence initiates a modified examination workflow, example which is outlined with the following acts. In the next act 104, a metal localizer scan is carried out. The images acquired with the metal localizer scan are then transferred to a user interface 204 and presented to the user in act 301. While in a following act 105, an additional metal detection sequence is run, the user specifies in act 303 a relevant anatomic area based on the localizer images by defining bounding boxes on the localizer images. This information is useful to determine how much the implant affects the actual diagnostic region and allows determination of the distance between the metal object's location and the actual region of interest to be examined for diagnosis and therefore to determine the influence of the metal object due to induced distortions. At the same time, the additional metal detection sequence 105 provides more detailed information about the severity of field distortions and its spatial location. For example, the additional metal detection sequence can be a fast scan with moderate spatial resolution acquiring signal at different off resonant frequency ranges. The additional metal detection sequence 105 may be helpful to determine the optimal scan strategy later on. The results of the additional metal detection sequence 105 may be used to classify the distortion level and location of the metal object (optionally, with the help of the results from the localization and the set bounding boxes). Optionally, the type of metal may be evaluated, as well. The distortion level and/or the classification of the distortion level may then be transmitted to the user interface 205. Based on the result of the additional metal sequence and the determined distance, the user may then select a scan protocol in act 302. Therein, the control unit may provide the user with one or several suggestions concerning which scan protocol to choose or how to adapt a scan protocol. For example, a first scan protocol 107 may be adapted for low distortions requiring only adapted fat suppression sequences, a second scan protocol 108 may be adapted for moderate distortions requiring high-bandwidth adapted sequences, and a third scan protocol 109 may be adapted for severe distortions requiring special sequences with dedicated distortion features. The scan protocols to choose from may for example be in terms of sequence type, sequence parameter including field of view and/or scan volume, and a number of sequences to be applied. Preferably the scan protocol may be setup providing the shortest total scan time possible while achieving optimal image quality. In act 106, the control unit switches to the selected scan protocol (107, 108, or 109) which is then to be carried out.

Figure 2:
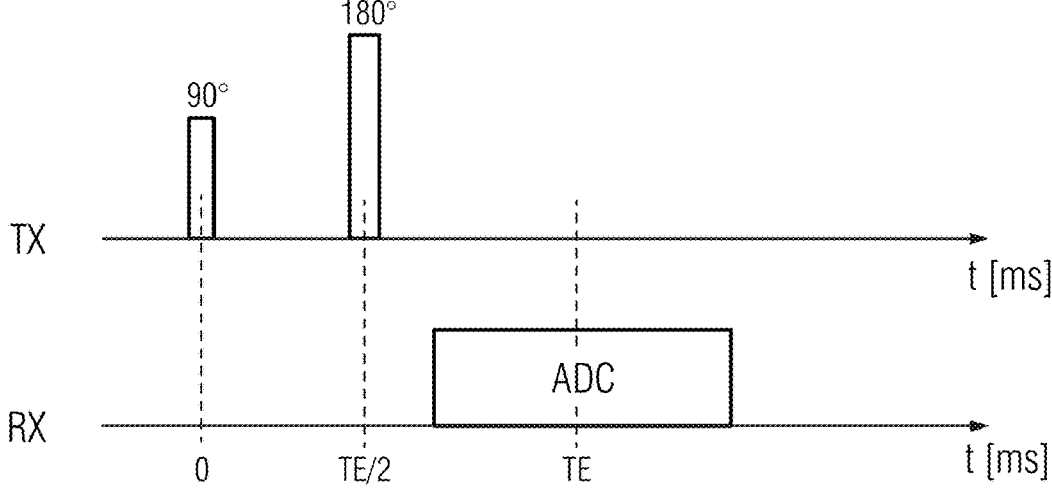
FIG. 2 shows an example for a possible fast metal detection sequence.
Figure 3:
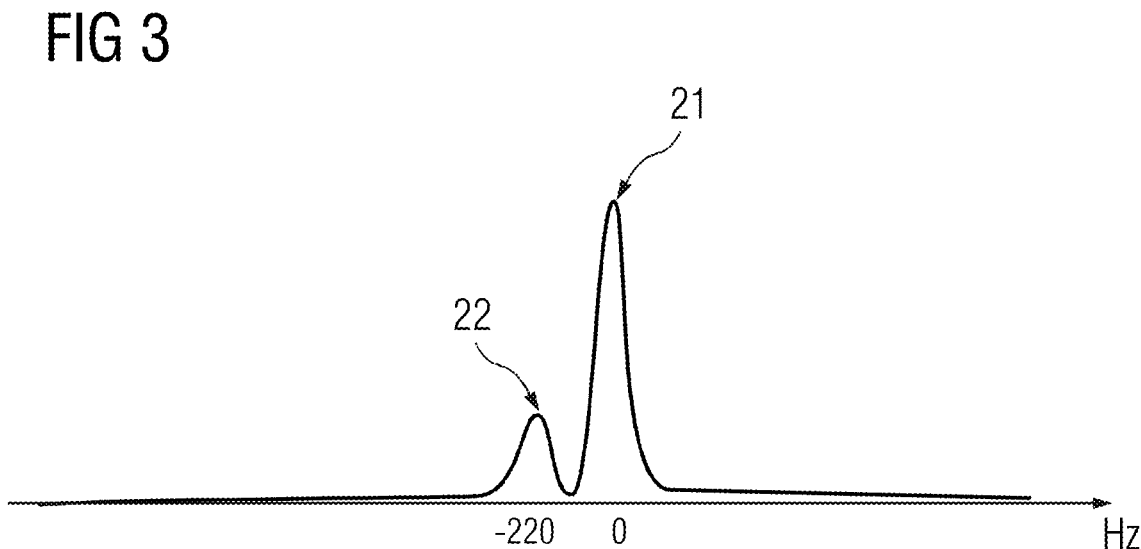
FIG. 3 shows an example frequency spectrum obtained without a metal object being present.
Figure 4:
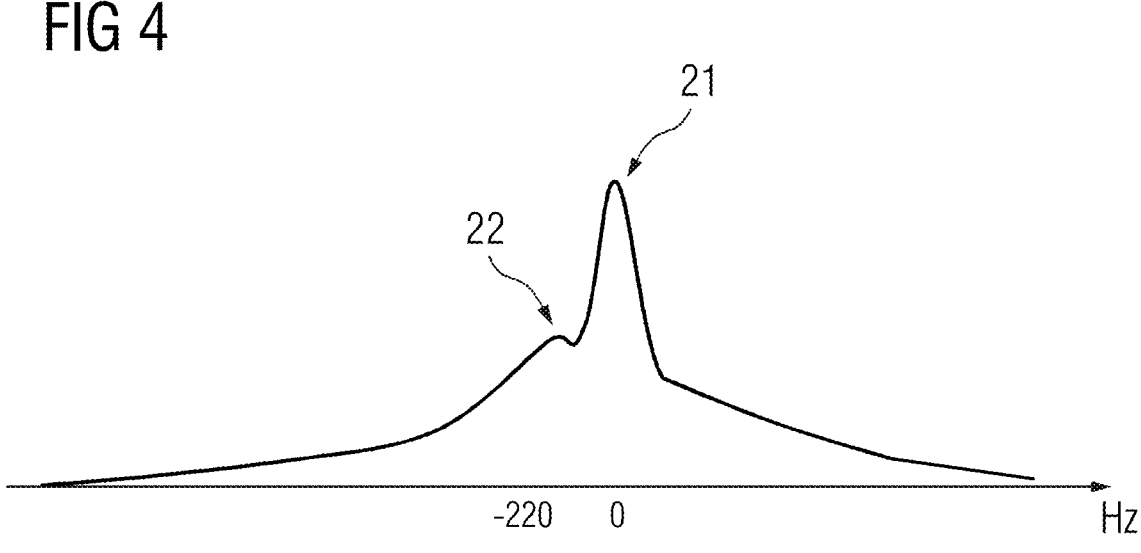
FIG. 4 shows an example frequency spectrum obtained with a metal object being present.

FIG. 2 shows an example for a possible fast metal detection sequence to be carried out by the magnetic resonance imaging system 1. FIG. 3 shows a corresponding frequency spectrum measured without a metal object being present in or at the subject. Therein, a water peak 21 and a fat peak 22 can be seen. As can be seen in FIG. 4, the corresponding peaks are significantly broadened in a frequency spectrum where a metal object was present in the subject.

Figure 5:
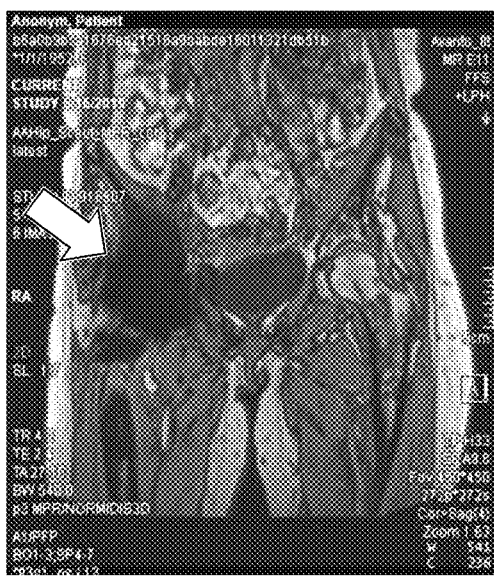
FIG. 5 shows example MR images obtained with a standard localizer scan.
Figure 5:
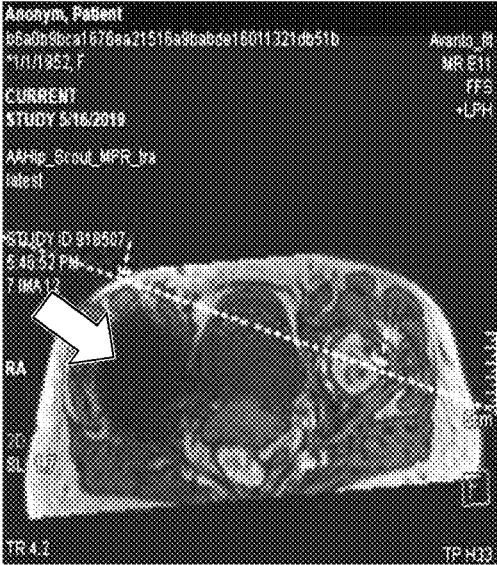
Figure 6:
FIG. 6 shows example MR images obtained with a metal localizer scan.
Figure 6:
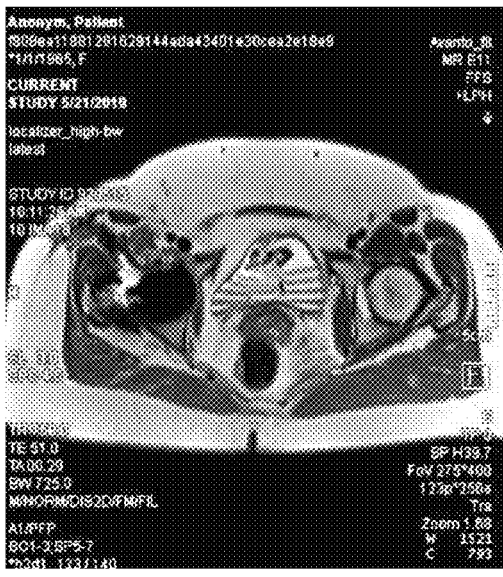

FIG. 5 shows MR images obtained with a standard localizer scan, while FIG. 6 shows MR images obtained with a metal localizer scan. For the standard localizer scan, a gradient-echo sequence was used, which, however, may cause problems around metal implants. As indicated by the arrows, there are signal voids caused by distortions of the local magnetic field due to a metal object (a metal implant in this case). Therefore, the anatomy around the metal implants is not visible, and the images can hardly be used to plan the slice orientations for the following diagnostic scans. For the metal localizer scan, a turbo-spin-echo sequence with high-bandwidth excitation and receive parameters has been used. As can be seen in FIG. 6, the areas, that are hardly discernible in FIG. 5 (around the arrows) can be recognized much better giving more anatomical details around the metal implant.

Figure 7:
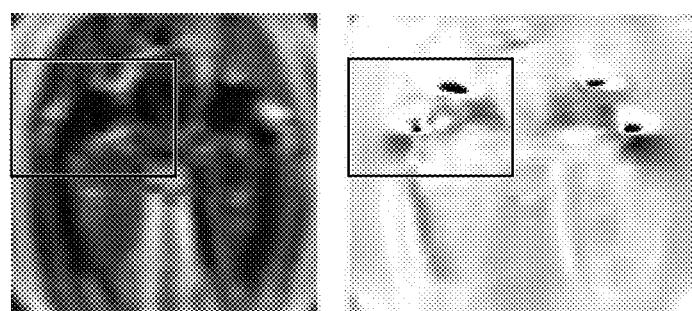
FIG. 7 shows an example of how a smaller distance to the metal object may affect the choice of the scan protocol.
Figure 8:
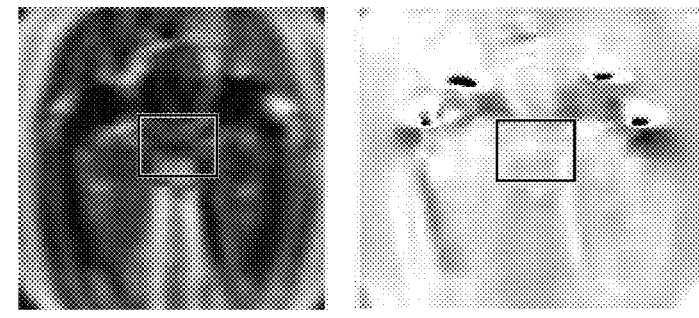
FIG. 8 shows an example of how a greater distance to the metal object may affect the choice of the scan protocol.

FIGS. 7 and 8 show an example of how the distance to the metal object may affect the choice of the scan protocol. The left images show a low-resolution anatomic image from a MSI (Multi-Spectral-Imaging) sequence, and the right images show a calculated off-resonance map from that MSI sequence (red and blue (grayscale in FIGS. 7 and 8) colours assign off-resonance signal positive or negative off-resonance signal up to several 1000 Hz). For examining the hip joint (box in FIG. 7) there are severe field distortions (greater 1 kHz) in this image. Consequently, standard sequences would not be able to provide a diagnostic image quality and a dedicated sequence for metal artifact suppression, e.g., a SEMAC sequence, will be used. For the examination of the prostate (box in FIG. 8), however, the frequency map shows only small field distortions (smaller than 400 Hz). Consequently, standard sequences where only the readout bandwidth is increased may be used. Since, in this example, frequency offsets in the range of fat tissue are present (i.e., they are around 200 Hz), the conventional spectral fat suppression sequences may be replaced by STIR (short tau inversion recovery) sequences, which provide robust fat suppression even in the presence of field distortions.

Figure 9:
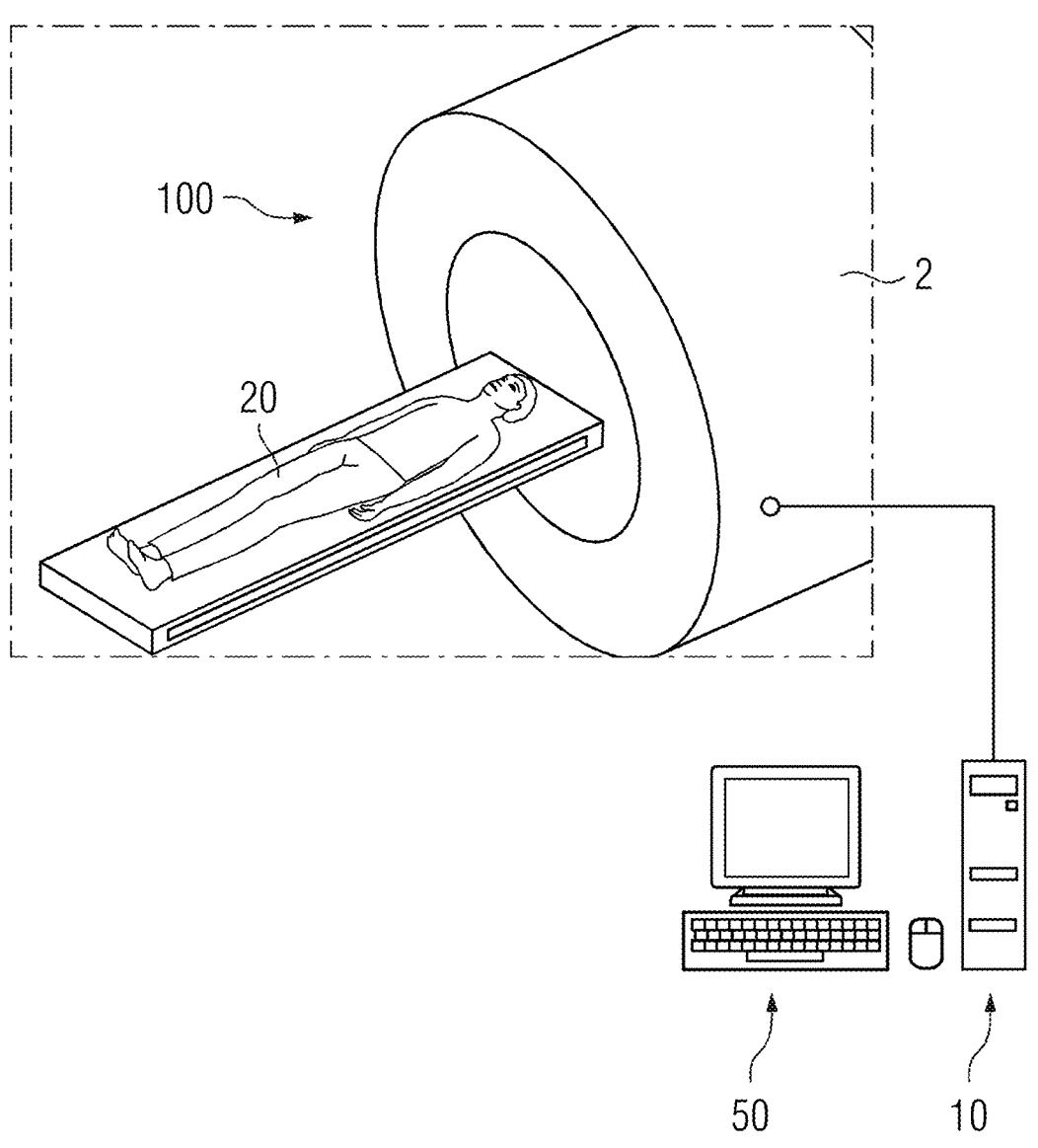
FIG. 9 shows an embodiment of a magnetic resonance imaging system.

FIG. 9 shows an embodiment of a magnetic resonance imaging system 1 according to an embodiment. The magnetic resonance imaging system 1 includes a magnetic resonance scanner 2 and a control unit (controller) 10. The control unit 10 is configured to initiate a fast metal detection sequence via the magnetic resonance scanner 2 to detect the presence of a metal object within or at the subject 20. The control unit 10 initiates a standard examination workflow including scanning the subject with a standard scan protocol of the magnetic resonance scanner 2 when no metal object is detected during the fast metal detection sequence and a modified examination workflow when a metal object is detected during the fast metal detection sequence. A User may interact with the control unit 10 via a user interface 50 and the control unit is configured to output information and/or suggestions via an output device of the user interface 50 and to receive user input via a user input device of the user interface 50. The control unit 10, such as a computer, may include a non-transitory computer readable storage medium storing instructions for operation by the control unit 10 to control the MR scanner 2 and/or receive input and provide output to the user interface 50.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method for carrying out a magnetic resonance imaging examination of an anatomic region of a subject with a magnetic resonance imaging system, the method comprising:

carrying out a fast metal detection sequence configured to detect the presence of a metal object within or at the subject;

initiating, by a controller, a modified examination workflow that is different from a standard examination workflow after the metal object is detected during the fast metal detection sequence, wherein the modified examination workflow comprises a metal localizer scan, wherein the metal localizer scan uses a turbo spin echo sequence with high bandwidth excitation and receive parameters to provides at least one scout image with reduced signal voids around the metal object compared to a standard localizer scan, wherein the modified examination workflow further comprises a request for a user to specify a region of interest on the at least one scout image; and carrying out the modified examination.

2. The method according to claim 1, wherein the fast metal detection sequence is configured to have a duration of 0.01 s to 10 s.

3. The method according to claim 1, wherein the fast metal detection sequence is configured to have a duration of 1 s to 3 s.

4. The method according to claim 1, wherein the fast metal detection sequence is carried out by the magnetic resonance imaging system using a transmit coil, wherein the transmit coil is operated in a pulse mode and/or in a continuous wave mode.

5. The method according to claim 1, wherein the fast metal detection sequence is carried out without or with very low spatial resolution having a voxel size larger than 1 cm3 in the anatomical region.

6. The method according to claim 1, wherein the fast metal detection sequence is carried out without or with very low spatial resolution having a voxel size larger than 5 to 100 cm3 in the anatomical region.

7. The method according to claim 1, wherein the fast metal detection sequence is configured to detect off-resonant signals as an indication for the presence of the metal object.

8. The method according to claim 1, wherein the modified examination workflow further comprises at least one additional metal detection scan and wherein the user specified region of interest is used to determine a location for carrying out the additional metal detection scan.

9. The method according to claim 8, wherein the modified examination workflow comprises an adapted scan protocol, wherein the adapted scan protocol is adapted based on the results of the at least one additional metal detection scan.

10. The method according to claim 1, wherein the controller choses from at least three scan protocols to be carried out, wherein a first scan protocol is a standard protocol that is carried out as part of a standard examination workflow when no metal object is detected, wherein a second scan protocol is an adapted scan protocol that is carried out after a metal object is detected that has a first range of influence on a region of interest to be examined, wherein a third scan protocol is an adapted scan protocol that is carried out after a metal object is detected that has a second range of influence on the region of interest to be examined, the first range of influence being less than the second range.

11. The method according to claim 1, wherein the modified examination workflow comprises giving information and/or suggestions to a user, and/or allowing the user to choose from multiple options regarding at least one scan protocol to be carried out, wherein the multiple options comprise choosing from multiple adapted scan protocols to be carried out and/or choosing from multiple adaptions to be applied to the at least one scan protocol.

12. The method according to claim 1, wherein, during the modified examination workflow, a user is asked for input to specify the region of interest on a scout image acquired using a metal localizer scan, wherein the user input is used by the controller to determine which adapted scan protocol to apply or how to adapt the scan protocol.

13. A non-transitory computer-readable medium comprising a computer program with instructions that when carried out on a processor of a magnetic resonance imaging system cause the magnetic resonance imaging system to:

carry out a fast metal detection sequence configured to detect the presence of a metal object within or at a subject;

determine that the metal object is detected, initiate, by a controller, a modified examination workflow that is different from a standard examination workflow after the metal object is detected during the fast metal detection sequence, wherein the modified examination workflow comprises a metal localizer scan comprising a turbo-spin-echo sequence with high-bandwidth excitation and receive parameters, wherein the metal localizer scan provides at least one scout image with reduced signal voids around the metal object compared to a standard localizer scan, wherein the modified examination workflow further comprises a request for a user to specify a region of interest on the at least one scout image; and carry out the the modified examination workflow.

14. A magnetic resonance imaging system for examining a subject, the magnetic resonance imaging system comprising:

a magnetic resonance scanner; and a controller, wherein the controller is configured to initiate a fast metal detection sequence via the magnetic resonance scanner and/or via a metal detector, and initiate a standard examination workflow including scanning the subject with a standard scan protocol of the magnetic resonance scanner after no metal object is detected during the fast metal detection sequence, and initiate a modified examination workflow that is different from the standard examination workflow, wherein the modified examination workflow is initiated after a metal object is detected during the fast metal detection sequence, wherein the modified examination workflow comprises a metal localizer scan comprising a turbo-spin-echo sequence with high-bandwidth excitation and receive parameters, wherein the metal localizer scan provides at least one scout image with reduced signal voids around the metal object compared to a standard localizer scan, wherein the modified examination workflow further comprises a request for a user to specify a region of interest on the at least one scout image.

15. The magnetic resonance imaging system according to claim 14 wherein the controller is configured to initiate the modified examination workflow as a scan of the subject with an adapted scan protocol of the magnetic resonance scanner.

16. The magnetic resonance imaging system according to claim 14, further comprising:

an output device configured to output optical and/or acoustic information to the user; and a user input device configured to receive user input, wherein the controller is configured to output information and/or suggestions for the user via the output device when a metal object is detected, to receive user input via the user input device, and to adapt the scan protocol and/or the examination workflow based on the user input.

\* \* \* \* \*